United States Patent [19]
Garner et al.

[11] Patent Number: 5,187,642
[45] Date of Patent: Feb. 16, 1993

[54] LIGHTWEIGHT SEALED CIRCUIT BOARD ASSEMBLY

[75] Inventors: Ronald N. Garner, Brockton; Robert D. Vernon, Norfolk, both of Mass.

[73] Assignee: The Foxboro Company, Foxboro, Mass.

[21] Appl. No.: 750,447

[22] Filed: Aug. 20, 1991

Related U.S. Application Data

[63] Continuation of Ser. No. 455,463, Dec. 22, 1989, abandoned.

[51] Int. Cl.$^5$ .................................................. H05K 7/20
[52] U.S. Cl. ..................................... 361/386; 174/52.3; 361/395; 361/424
[58] Field of Search .................. 165/80.3, 185, 104.33; 211/41; 174/51, 51.1, 51.3, 16.1, 16.3, 252; 361/334, 356, 380, 383, 386–388, 392, 427, 395, 399, 412, 413, 415, 424, 390, 391

[56] References Cited

U.S. PATENT DOCUMENTS

| | | | |
|---|---|---|---|
| 3,052,821 | 9/1962 | Scoville | 174/52.1 |
| 3,579,046 | 5/1971 | Jordan | 361/412 |
| 3,833,836 | 9/1974 | Moksu | 361/386 |
| 4,218,724 | 8/1980 | Kaufman | 361/395 |
| 4,631,641 | 12/1986 | Brombal | 361/424 |
| 4,723,196 | 2/1988 | Hofmeister | 361/399 |
| 4,821,145 | 4/1989 | Corfits | 361/383 |
| 4,823,235 | 4/1989 | Suzuki | 361/395 |
| 4,872,091 | 10/1989 | Maniwa | 361/424 |
| 4,872,212 | 10/1989 | Roos | 361/424 |
| 4,873,615 | 10/1989 | Grabbe | 361/395 |
| 4,910,867 | 3/1990 | Weigert | 29/839 |
| 4,970,625 | 11/1990 | Belanger | 361/424 |

OTHER PUBLICATIONS

Ventilation—Systems, Hammer, vol. 17 No. 9 Feb. 1975 pp. 25–29.

*Primary Examiner*—Gerald P. Tolin
*Attorney, Agent, or Firm*—Lahive & Cockfield

[57] ABSTRACT

An integrated circuit board assembly includes two integrated circuit boards. The integrated circuit boards have an electronic circuitry configured on the interior face and a dielectric sealant on the other face. The integrated circuit boards are secured to a frame in such a manner that the interior faces of the integrated circuit boards face inward toward each other. The securing of the frame to the integrated circuit boards is such that it forms a sealed enclosure protecting the electronic circuitry configured therein from the process environment. The exterior faces, however, are exposed to the process environment and are helpful in dissipating heat to the exterior environment.

8 Claims, 5 Drawing Sheets

LIGHTWEIGHT SEALED CIRCUIT BOARD ASSEMBLY

This is a continuation of application Ser. No. 455,463, filed on Dec. 22, 1989, now abandoned.

FIELD OF THE INVENTION

This invention relates generally to the field of packaging of electronic components.

BACKGROUND OF THE INVENTION

Data processing systems installed within process environments face a number of problems not ordinarily faced by systems installed in other environments. In particular, such data processing systems installed in process environments must be able to withstand high temperatures and operate effectively in contaminated environments.

One solution to the problem of data processing systems withstanding the high temperatures of process environment has been to dispose the integrated circuit boards of the data processing systems within protective modular units. The modular units each include a housing that entirely encompasses the integrated circuit boards of the modular unit. Typically, in such units at least one side of the housing is comprised of a heavy sheet of metal which forms a structurally supporting element of the housing. The sheet serves primarily as a heat sink to dissipate heat generated by the electric components. Heat passed to the metal sheet is removed from the module by air that is blown across the module. The integrated circuit board and metal siding are typically attached by an adhesive.

SUMMARY OF THE INVENTION

The present invention concerns an apparatus comprising at least one integrated circuit board. It preferably has two integrated circuit boards. Each integrated circuit board has electronic circuitry components configured on one side. A frame is secured to the at least one integrated circuit board in such a manner as to form a sealed enclosure. Each of the integrated circuit boards forms a side of the sealed enclosure. The electronic circuitry of the integrated circuit boards is situated so that it resides within this sealed enclosure and hence, is protected from the process environment.

The exterior sides of the integrated circuit boards preferably are exposed to cooling air procured from the process environment. In particular, heat produced by the electronic components that would otherwise accumulate at the components is dissipated from the interior surface of the circuit boards to the exterior surface where it is removed by an air stream. The exterior surfaces are covered with a dielectric sealant so as to electrically insulate the integrated circuit board and thus, protect the electronic components figured on the circuit boards.

The frame preferably has a unitary construction and is lightweight. A suitable material that can be formed into a unitary frame and still be light-weight is plastic. Other materials such as certain dielectrics may also be appropriate.

The integrated circuit boards and the frame are secured by a securing means. The components may be secured to such an extent that they are essentially airtight. Such a seal isolates and protects the electronic components from the process environment. Moreover, the seal prevents potentially explosive gases in the process environment from being exposed to the current carrying electrical components that might, absent the seal, ignite the gases. The securing means may include plastic welds, adhesives, non-plastics welds, screws and snap-fastened covers. When snap-fastened covers are used, they are preferably designed so as to also protect the electronic connectors of the integrated circuit boards. The use of simple securing means such as snap-fastened covers and the like greatly simplifies the assembly process for the modular unit. As a result, it is significantly less labor intensive than its currently available counterparts.

The assembly produced when the integrated circuit boards are secured to the frame, is a modular unit. It may be used in parallel so as to form an array of modular units within a data processing system.

DETAILED DESCRIPTION OF THE PREFERRED EMBODIMENT

The preferred embodiment of the present invention provides a lightweight sealed modular circuit board assembly 8 for holding integrated circuit boards in a data processing system. It is specially designed for use in a process environment having extreme temperatures and an abundance of ambient contaminants. The preferred embodiment provides protection from the process environment by making the assembly a sealed enclosure that isolates the electronic components of the integrated circuit boards from the hostile process environment, and by providing an assembly that facilitates dispersal of the heat generated by the electronic components so that high operating temperatures do not pose a problem. Moreover, the preferred embodiment is easily assembled and is inexpensive to manufacture.

Figure 1:
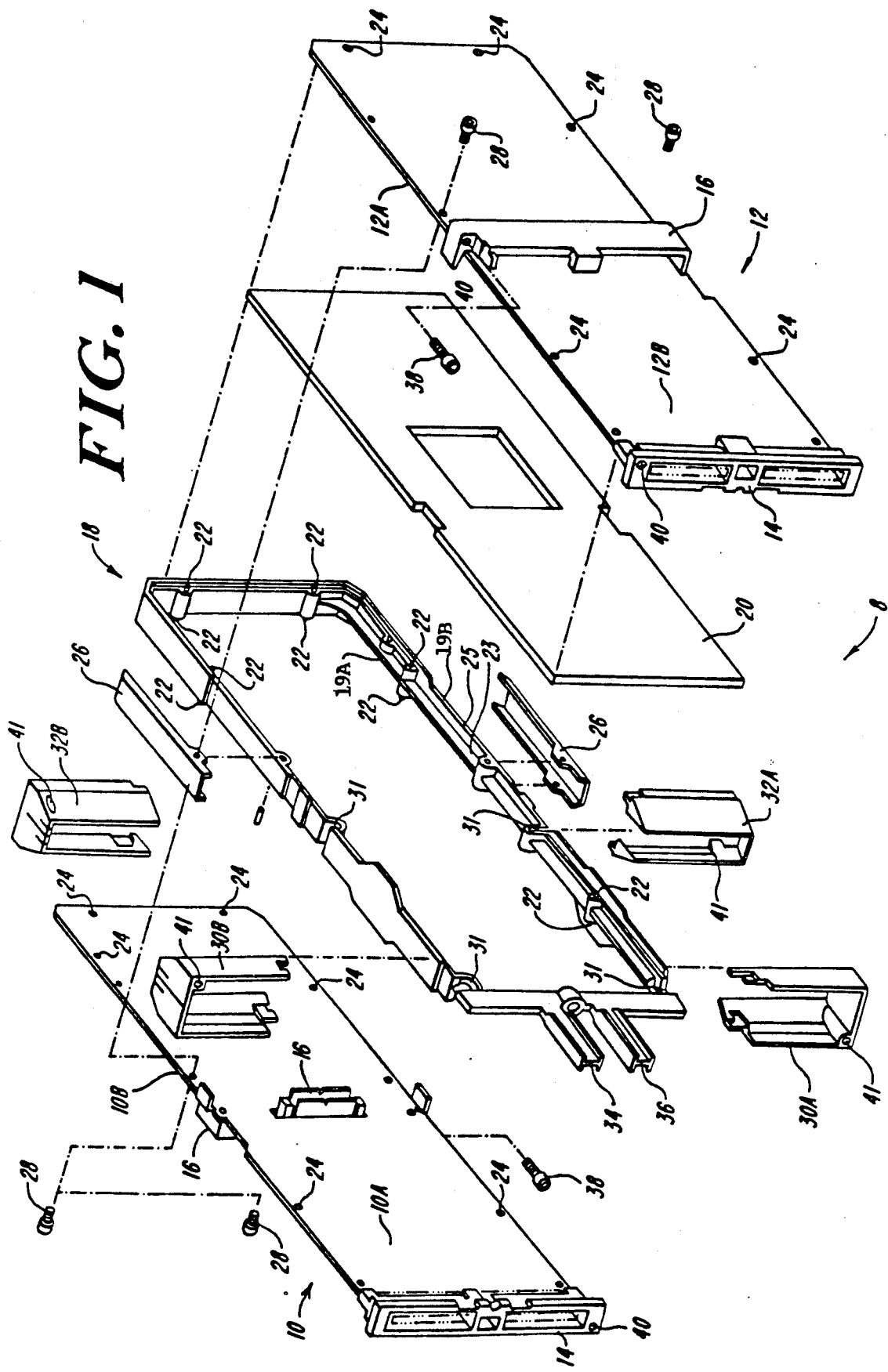
FIG. 1 depicts an exploded view of the integrated circuit board modular assembly of this invention.
Figure 2:
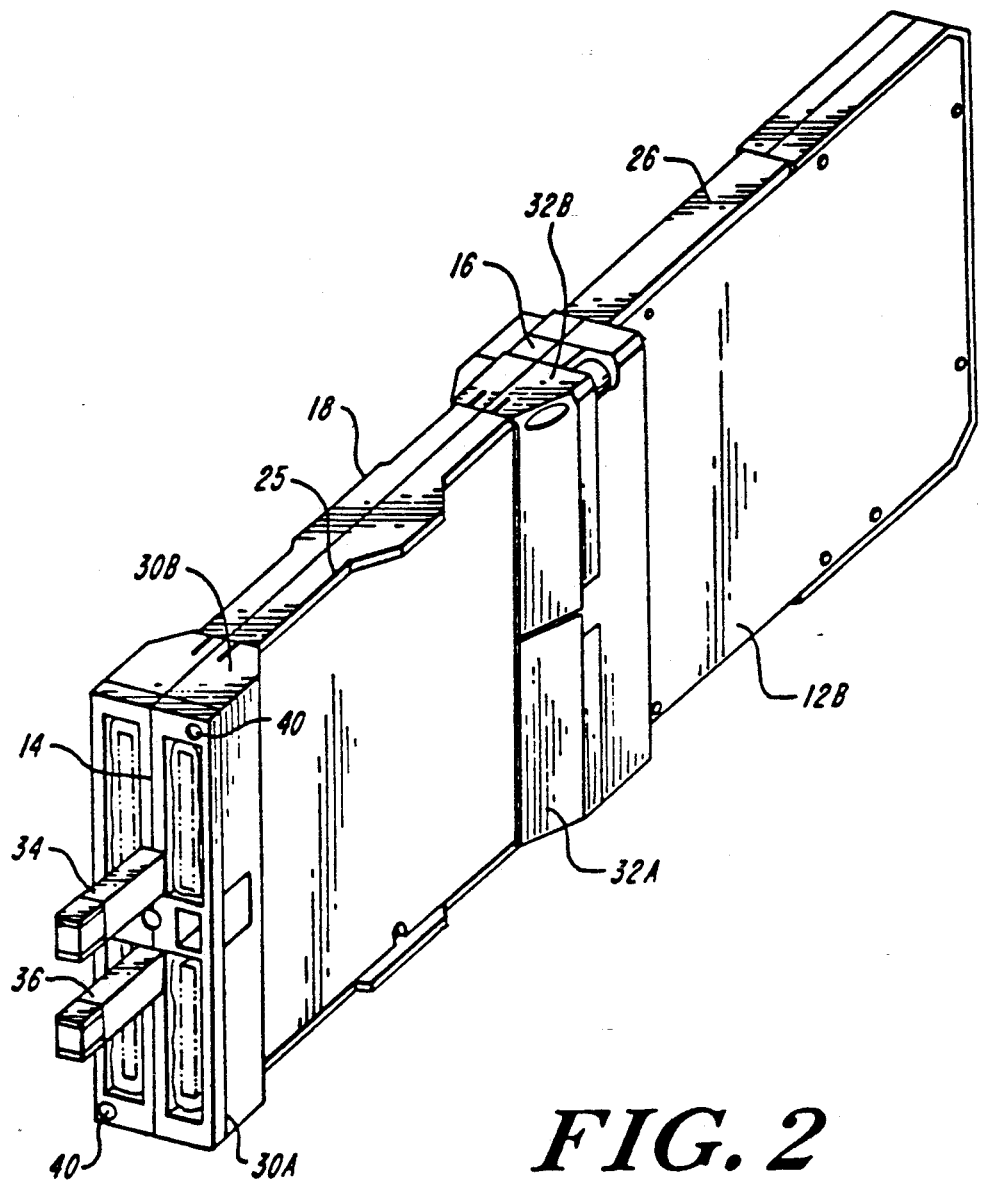
FIG. 2 depicts a perspective view of the integrated circuit board modular assembly of this invention.

FIG. 1 shows a preferred embodiment of the present invention from an exploded view. FIG. 2 shows the same assembly in a non-exploded perspective view. The assembly module 8 is primarily comprised of two integrated circuit boards 10, 12 and a frame 18. The integrated circuit boards 10 and 12 may be fabricated using traditional techniques that are well known in the prior art. Furthermore, the circuit boards can be fabricated out of heat and flame resistant material so that the assembly can withstand especially harsh process environments. The heat and flame resistant material may be thin sheets of flame resistant ceramic material or may be sheets of conventional material protected by a thin layer of metal or metal foil. Such metal or metal foil are not structural elements of the assembly but rather act merely as heat shields.

The boards 10 and 12 each have two sides: an interior side 10A, 12A and an exterior side 10B, 12B. The electronic components, such as integrated circuitry, are configured on the interior sides 10A and 12A. The exterior sides 10B and 12B contain no such electronic circuitry; they may, however, be coated with a dielectric sealant, indicated by dashed line S, such as that sold under the trademark, Vacrel. Other dielectric materials also may be used. The dielectric sealant serves to electronically insulate the components configured on the circuit boards. Each of the integrated circuit boards 10 and 12 contain two sets of electrical connectors 14 and 16 that connect the integrated circuit boards to the rest of the data processing system.

The assembly also includes a lightweight frame 18 that serves as a skeletal structure to which the integrated circuit boards 10 and 12 are attached. The frame 18 is preferably comprised of a lightweight and inexpensive dielectric material such as plastic. If a flame and heat resistant module is desirable, the frame 18 may be comprised of flame resistant dielectric plastic or plastic-like material. In such cases, the integrated circuit boards are also made of flame and heat resistant materials as described above. One advantage of employing a plastic frame 18 is that the entire frame 18 may be produced in a single mold. Whatever material is chosen, the frame 18, nevertheless, has a unitary construction (i.e. the frame is made as a single piece). The unitary characteristic of the frame allows for ease in fabrication, ease in assembly and high structural integrity.

The geometry of the frame 18 is such that the integrated circuit boards 10 and 12 fit evenly on respective sides of the frame 18. Each board 10, 12 fits flush with an exterior ridge 25 of the frame 18. Each rests on top of a respective intermediate ridge 19A, 19B that positions the associated integrated board so it is flush with the exterior ridge 25. A non-conductive foam filler 20 or similar material is placed between the two interior surfaces 10A and 12A on an interior ridge 23 to fill free the volume and to minimize condensation and the ingress of contaminated air. Filler 20 also prevents electrical shorts or arcing occur when the two integrated circuit boards 10 and 12 are placed into the frame in close proximity. The insulating foam filler 20 has a hole in it to allow connectors 16 from the respective integrated circuit boards 10 12 to be coupled.

The integrated circuit boards 10 and 12 and the insulating layer 20 are placed onto the frame as shown by the dotted lines in FIG. 1, and as indicated in FIG. 2. The result of this configuration is that the electronic components on the interior sides 10A and 12A of the integrated circuit boards 10 and 12, are enclosed within the interior of the assembly, and the exterior sides 10B and 12B form the outer surface of the assembly.

Once the integrated circuit boards 10 and 12 are placed onto the frame 18, they must be secured. The frame 18 contains a number of plastic posts 22 that are placed about its perimeter. These posts 22 fit into corresponding holes 24 in the respective integrated circuit boards 10 and 12. Once the integrated circuit boards 10 and 12 are properly positioned, the plastic posts 22 are partially melted or secured via the local application of heat to create plastic welds 22 that secure the assembly. It should be borne in mind that alternative means of securing the assembly may be used. For instance, ultrasonic welding and adhesives may be used. In addition to the plastic welds, snap-fastened covers and screws are used in the preferred embodiment for additional coupling and are discussed in more detail below.

Figure 3:
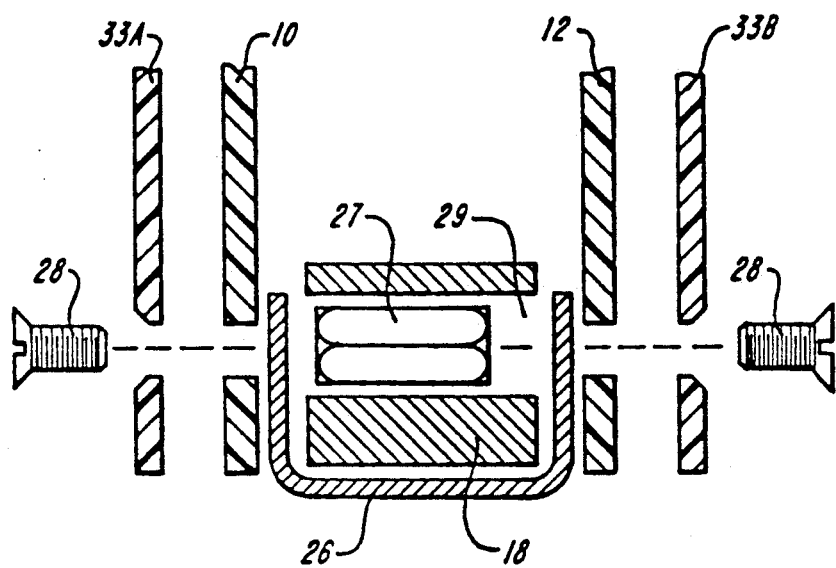
FIG. 3 is a partial cross-section of the circuit board modular assembly depicting the connection of the metal rails serving as ground connections for the integrated circuit boards.

Metal rails 26 are positioned near the center of the frame 18 (indicated by the dotted lines of FIG. 1). The metal rails are connected to and serve as ground connections for the two integrated circuit boards 10 and 12. The metal rails 26 are designed with lips that fit snugly around the frame 18. Referring to FIG. 3, a threaded metal insert 27 is fitted into a channel 29 formed in the plastic frame 18. Both the channel 29 and the insert 27 have a hexagonal shape to prevent the insert from rotating. Insert 27 is sized to be a loose slip fit within channel 29, and its overall length is less than the thickness of the frame 18. Metal rail 26 snaps onto the frame 18 and retains insert 27 by partially covering both sides of channel 29. Screws 28 are inserted through the circuit boards 10 and 12 as shown, and tightened into the insert 27. Because the insert 27 is free to slide within the channel 29, insert 27 slides to one side of the frame 18 and compresses an exposed copper pad (not shown) on the circuit board against the rail 26 when the first screw is inserted and tightened. When the second screw is threaded through the other circuit board and into the other end of the insert 27, an electrical ground is again established by compression between the circuit board and the metal rail 26.

This assembly is particularly advantageous for grounding supplementary flame barriers 33a and 33b, which are typically metal sheets, attached to the exterior of the module assembly. A further advantage of this assembly is that it allows for a unique, low-cost, and highly reliable method for establishing the ground path between the circuit boards 10 and 12 and the external metal rails 26. It further allows for the manufacture of the assembly without concern for the cumulative effects of manufacturing tolerances of the various parts.

Snap-fastened covers 30A, 30B, 32A and 32B are used to cover the electrical connectors 14 and 16 and to clamp the assembly together. The snap-fastened covers are sufficiently flexible to ride over pertrusions and snap into the frame 18 and each other end to end when assembled. The frame 18 includes recesses 31 into which the snap-fastened covers 30A, 30B, 32A and 32B interlock. Moreover, the snap-fastened covers also interlock with the electrical, connectors 14 and 16 that they cover and draw the connectors together and hold them in contact with each other; thus, assuring proper alignment of the rows of contact pins. As can be seen in FIGS. 1 and 2, each snap-fastened cover covers one half of the assembly at the point at which it is attached. An additional benefit of the snap-fastened covers 30A, 30B, 32A and 32B is that they properly position and secure the integrated circuit boards 10 and 12 relative to the frame 18.

The net result of the securing of the integrated circuit boards 10 and 12 to the frame 18 is to create a protected environment. In this preferred embodiment, the protected environment is sealed though not hermetically sealed. Nevertheless, it is almost airtight and prevents the majority of contaminants from entering the sealed enclosure. As noted above, the electronic components configured on the integrated circuit boards 10 and 12 lie on the interior face 10A and 12A of the integrated circuit boards 10 and 12. They are, thus, within this protected environment and are not exposed to the troublesome contaminants that may exist in the surrounding process environment and in the air driven past the module for cooling. Moreover, since this protected environment minimizes the exposure of process gases in the process environment to the electrical components of the integrated circuit boards, it reduces the likelihood of ignition of the process gases. Additional protection is achieved by using sealant to fill holes that would allow exposure of the process gases or corrosive elements to the electronic components.

In some particularly hostile environments, it may be necessary to include a thin resilient gasket between the major components in order to hermetically seal the module. In particular, gaskets are placed along the periphery of interfaces of the integrated circuit boards 10 and 12 with the frame 18. The gaskets are, for instance, placed on the ridges 27 and 29 to form an airtight hermetic seal.

The assembly is a modular unit. It is designed to be used along with other similar modular units in an information processing system. Specifically, it is intended that many of these modular units be employed to form a large modular array. To facilitate incorporation into the data processing environment, two prongs 34 and 36 extend from one end of the frame 18. These prongs 34 and 36 are used to properly locate the modular unit into such an array of modular units. In addition, screws 38 are employed to attach the male electrical connectors 14 and 16 of the integrated circuit boards 10 and 12 to the female electrical connectors of the information processing system. Holes 40 are provided in the electrical connectors 14 and 16 to allow the screws 38 to pass through the connectors. In addition, holes 41 are also provided in the snap-fastened covers to allow the screws 38 to pass through the snap-fastened covers.

Although the sealed enclosure alleviates the problem of contaminants corrupting the electronic components, it, standing alone, does not alleviate the problem of high temperatures. In order to operate effectively, the system must not allow heat to accumulate at the electronic components. Heat generated by the electronic components is transferred through the inner surfaces 10A and 12A of the substrates of the integrated circuit boards to the exterior surfaces 10B and 12B. To help transfer this heat, electronic components such as an IC, are mounted so that its chip is as close as possible to inner surfaces 10A and 12A to shorten the thermal conductive path. These surfaces are exposed to the process environment so that heat is allowed to escape into the process environment. The integrated circuit boards 10 and 12 have a sufficient thickness so as not to be fragile while still having minimal thermal resistance. The preferred thickness is forty eight thousandths of an inch (i.e. 0.048").

Figure 4:
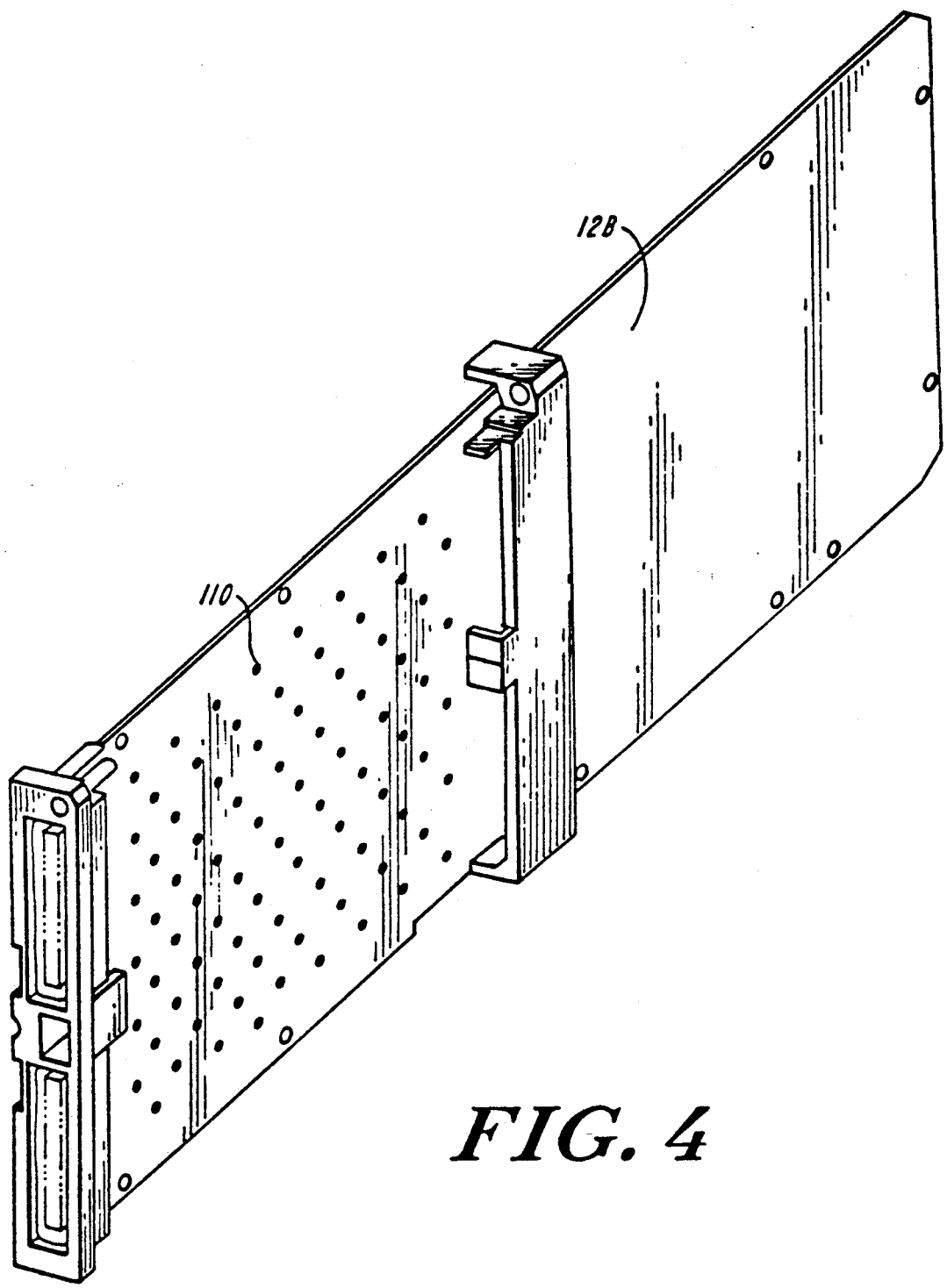
FIG. 4 depicts a heat sink arrangement used in an embodiment of this invention.
Figure 5:
FIG. 5 is a plan view of a heat sink structure suitable for use in the arrangement shown in FIG. 4.

Additional heat dispersal may be achieved by adding heat sinks 110 to the structure. Heat sinks 110 may be added to the exterior sides 10B and 12B of the integrated circuit boards such as shown for one half of exterior side 12B in FIG. 4. The heat sinks may be thermally connected to the electronic components via holes in the circuit board substrate, foil and sealant. These heat sinks 110 encourage the heat to flow to the exterior surfaces 10B and 12B where the heat is dissipated. Moreover, the spacing and alignment of the heat sinks 110 encourage efficient dissipation. The heat sinks 110 are positioned to remove excess heat from the components that generate the most heat. It should be noted that the heat sinks need not be placed across the entire exterior surfaces 10B and 12B; rather they ideally are positioned only at portions of the exterior surfaces 10B and 12B where they are most needed. FIG. 3 shows them placed on one half of the exterior surface 12B purely for illustrative purposes. While many suitable heat sink structures will be readily know to those skilled in the art, FIG. 5 shows a typical pin-fin heat sink structure which may be used.

Using the integrated circuit boards 10 and 12 as the walls of the sealed enclosure provides several advantages. A primary benefit of this approach is that it yields a rigid light weight structure. It also saves on manufacturing costs because fewer resources are needed than conventional systems. Further, the present invention simplifies the assembly process and thus, is less labor intensive than prior art systems. Moreover, by being directly in contact with the process environment, heat dispersal is more readily achieved for there is only a single level of thermal communication rather than the two levels as is common in prior art systems.

Another advantage of the system is that it protects the electrical components of the integrated circuit boards from the process environment that must otherwise harm them. This isolation, likewise, prevents the potentially explosive gases of the process environment from being exposed to electrical connections that could spark and ignite the gases. Furthermore, the modules are all similar regardless of the electrical circuitry configured on the circuit boards. The modular parts are standardized and thus, can be manufactured at low cost even when different electrical components are required.

While the invention has been particularly shown and described with reference to preferred embodiments thereof it will be understood by those skilled in the art that various changes in form and details may be made without departing from the spirit and scope of the invention as defined in the appended claims.

We claim:

1. An integrated circuit board assembly comprising
   a) a first integrated circuit board having electronic circuitry configured on a side thereof,
   b) a second integrated circuit board having electronic circuitry configured on a side thereof,
   c) a peripheral frame formed of a lightweight plastic material and assembled with said first and second integrated circuit boards along the peripheries of the boards to form a sealed enclosure therewith of which said integrated circuit boards form opposed sides, said integrated circuit boards being arranged so that the electronic circuitry resides within the enclosure, and
   d) electrically conductive means engaged with said frame for securing said integrated circuit boards to said frame and for externally grounding said integrated circuit cords, includes
      i. a metal rial engaging said frame,
      ii. a sliding insert fitted within a channel defined by said frame, wherein said insert has a length that is less that the length of said channel, and
      iii. securing means for movably sliding said insert to one side of the channel and compressing at least one said integrated circuit board against said metal rail for providing an external ground for said apparatus.

2. An integrated circuit board assembly comprising
   a) an integrated circuit board having electronic circuitry configured on a side thereof,
   b) a frame secured to said integrated circuit board and forming a sealed enclosure therewith of which said integrated circuit board forms a side, said integrated circuit board being arranged so that the electronic circuitry resides within the enclosure,
   c) a metal rail engaging said frame,
   d) a sliding insert fitted within a channel defined by said frame, wherein said insert has a length that is less than the length of said channel, and e) securing means movably sliding said insert to one side of the channel and compressing said integrated circuit board against said metal rail for providing an external ground for said assembly.

3. An assembly as set forth in claim 2 wherein said one integrated circuit board has a side free of said electronic circuitry, and has a sealant coating on said side that does not have electronic circuitry configured on it.

4. An assembly as set forth in claim 2 further comprising a second integrated circuit board having electronic circuitry configured on only one side thereof and arranged with respect to said one circuit board so that the sides of the boards upon which electronic circuitry is configured face one another.

5. An assembly as set forth in claim 2 wherein the frame is of unitary one-piece construction.

6. An assembly as set forth in claim 2 wherein the frame is made of a dielectric material.

7. An assembly as set forth in claim 2 wherein said one integrated circuit board has a side that faces away from the sealed enclosure and which is exposed to a process environment.

8. An assembly as set forth in claim 2 wherein further comprising heat sinks attached to said one integrated circuit board to aid in dissipating heat from said electronic circuitry to the process environment.

* * * * *